United States Patent
Sicard

(10) Patent No.: US 7,986,172 B2
(45) Date of Patent: Jul. 26, 2011

(54) SWITCHING CIRCUIT WITH GATE DRIVER HAVING PRECHARGE PERIOD AND METHOD THEREFOR

(75) Inventor: Thierry Sicard, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 40 days.

(21) Appl. No.: 12/550,696

(22) Filed: Aug. 31, 2009

(65) Prior Publication Data

US 2011/0050322 A1    Mar. 3, 2011

(51) Int. Cl.
*H03K 3/00* (2006.01)
(52) U.S. Cl. ......... 327/108; 327/112; 327/390; 327/589
(58) Field of Classification Search .................. 327/108, 327/112, 390, 589
See application file for complete search history.

(56) References Cited

U.S. PATENT DOCUMENTS

| | | | | |
|---|---|---|---|---|
| 4,902,919 A | * | 2/1990 | Spohrer et al. ................. | 326/88 |
| 5,559,452 A | * | 9/1996 | Saito ............................... | 326/88 |
| 5,828,245 A | * | 10/1998 | Brambilla et al. ............. | 327/108 |
| 5,828,262 A | * | 10/1998 | Rees ............................... | 327/390 |
| 5,905,402 A | * | 5/1999 | Kim et al. ....................... | 327/536 |
| 5,949,271 A | * | 9/1999 | Fujikura ......................... | 327/390 |
| 5,973,514 A | * | 10/1999 | Kuo et al. ........................ | 326/98 |
| 6,977,533 B2 | * | 12/2005 | Kernhof et al. ................ | 327/110 |
| 7,239,182 B2 | | 7/2007 | Fukazawa et al. | |
| 7,710,384 B2 | * | 5/2010 | Azami et al. ................... | 345/100 |
| 2007/0115705 A1 | | 5/2007 | Gotzenberger et al. | |
| 2007/0285951 A1 | | 12/2007 | Bien | |

* cited by examiner

*Primary Examiner* — Kenneth B. Wells
(74) *Attorney, Agent, or Firm* — Daniel D. Hill

(57) ABSTRACT

A switching circuit includes first and second transistors, and a driver circuit. The first transistor has a first current electrode coupled to a first power supply voltage terminal, a second current electrode, and a control electrode. The second transistor has a first current electrode coupled to the second current electrode of the first transistor, a second current electrode coupled to a second power supply voltage terminal, and a control electrode. The driver circuit has an input for receiving an input signal, and an output coupled to the control electrode of the first transistor. The driver circuit precharges the control electrode of the first transistor to a first predetermined voltage, and in response to the input signal transitioning from a first logic state to a second logic state, the driver circuit provides a second predetermined voltage to the control electrode of the first transistor to cause the first transistor to be conductive.

17 Claims, 4 Drawing Sheets

SWITCHING CIRCUIT WITH GATE DRIVER HAVING PRECHARGE PERIOD AND METHOD THEREFOR

BACKGROUND

1. Field

This disclosure relates generally to switching circuits, and more specifically, to a switching circuit with a gate driver having a precharge period and method therefor.

2. Related Art

Switching circuits, such as high-side switches and low-side switches, are used for supplying power to motors, lights, and other devices. Various transistor types may be used to implement a switching circuit. A metal-oxide semiconductor (MOS) transistor is one such transistor type.

A high side switch and a low side switch may be coupled together in a commonly known half bridge configuration. Two half bridge configurations may be coupled together to form an H bridge configuration. Typically, in the half bridge configuration the on and off states of the high side and low side switches are timed to alternately drive a load. However, if both the high side switch and low side switch are on at the same time, a current path may exist between the power supply voltage terminals that may result in excessive power consumption. Therefore, when driving the high and low side switches, care must be taken to ensure both are not conducting at the same time. On the other hand, in many applications, it is desirable for the high side switch to be switched on as soon as possible after the low side switch is switched off. The use of relatively tight timing control may result in inadvertent overlapping "on" states in some process corners.

The speed of the circuit may also be increased by maximizing the ramp up rate of the output voltage of the high side switch during the transition from off to fully on. However, this may cause excessive electromagnetic inference (EMI) that is undesirable in some applications.

Therefore, what is needed is a switching circuit that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
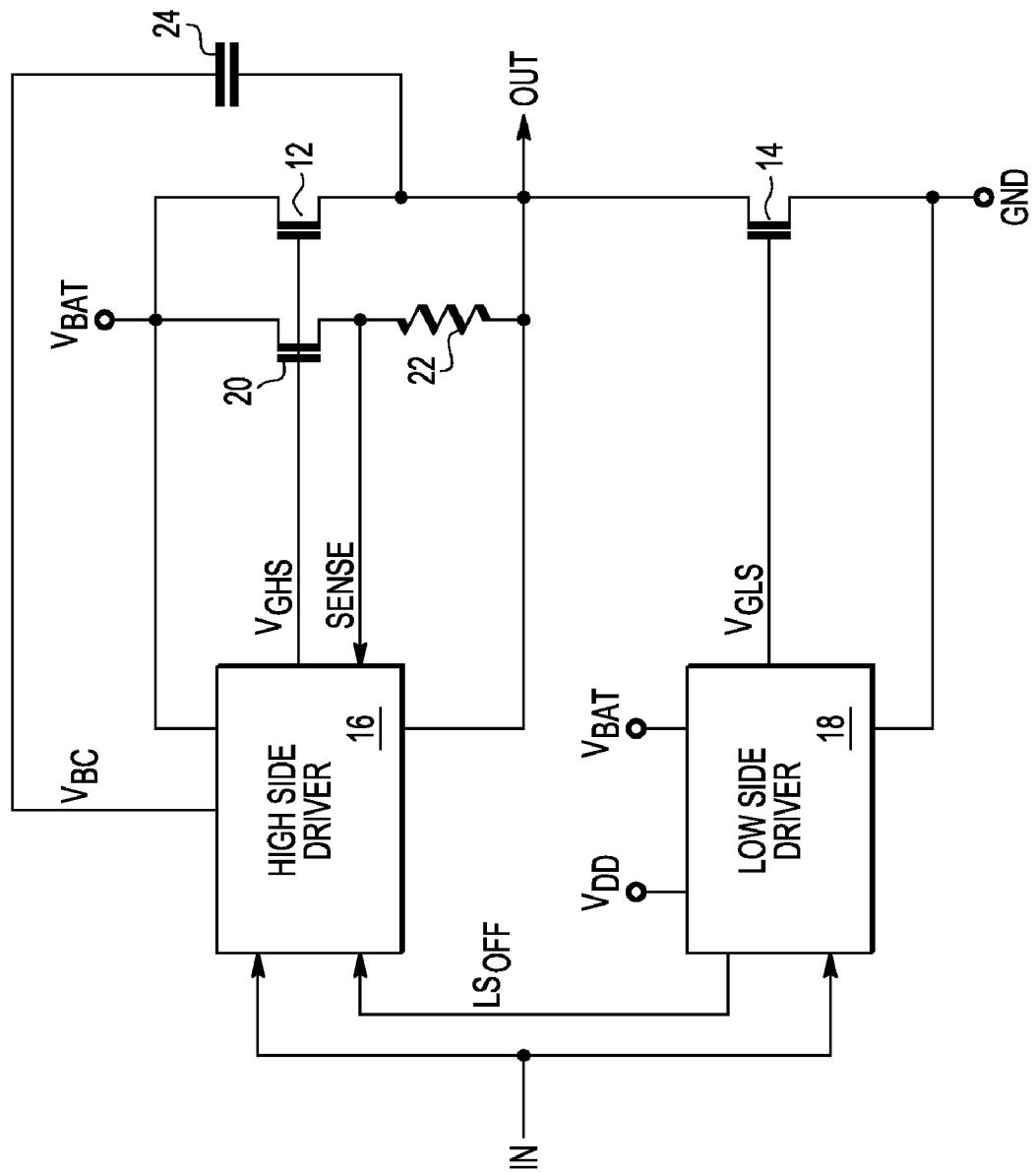
FIG. 1 illustrates, in partial block diagram form and partial schematic diagram form, a switching circuit in accordance with an embodiment.

Generally, there is provided a switching circuit that includes a high side transistor, a low side transistor, a high side driver circuit for driving a gate of the high side transistor, and a low side driver circuit for driving a gate of the low side transistor. A bootstrap capacitor is provided to boost the voltage at the gate of the high side transistor. In one embodiment, the high side and low side transistors are coupled together in a half bridge configuration. Prior to the low side transistor switching from on to off, the driver circuit causes the gate of the high side transistor to be precharged to a predetermined voltage that is approximately equal to a threshold voltage ($V_T$) of the high side transistor. The predetermined voltage is provided by a power supply voltage ($V_{BAT}$) instead of by the bootstrap capacitor. Then, in response to a control signal from the low side driver circuit, indicating that the low side transistor is off, the high side driver circuit causes a boosted gate voltage ($V_{BC}$) from the bootstrap capacitor to be applied to the gate of the high side transistor, switching on the high side transistor. By switching the high side transistor in this manner, the high side transistor can be switched on faster after the low side transistor is switched off. Also, by precharging the gate to the predetermined voltage using the power supply voltage ($V_{BAT}$), charge stored by the bootstrap capacitor is conserved. In addition, ramping up the gate voltage from the predetermined voltage causes less EMI than ramping up the gate voltage from ground.

In one aspect, there is provided a switching circuit comprising: a first transistor having a first current electrode coupled to a first power supply voltage terminal, a second current electrode, and a control electrode; a second transistor having a first current electrode coupled to the second current electrode of the first transistor, a second current electrode coupled to a second power supply voltage terminal, and a control electrode; and a first driver circuit having an input for receiving an input signal, and an output coupled to the control electrode of the first transistor, the first driver circuit for precharging the control electrode of the first transistor to a first predetermined voltage, and in response to the input signal transitioning from a first logic state to a second logic state, the first driver circuit providing a second predetermined voltage to the control electrode of the first transistor to cause the first transistor to be conductive. The first predetermined voltage may be equal to approximately a threshold voltage of the first transistor. The switching circuit may further comprise a second driver circuit having an output coupled to the control electrode of the second transistor. The second predetermined voltage may be above a power supply voltage provided to the first power supply voltage terminal. The switching circuit may further comprise a first comparator for sensing that a voltage at the control electrode of the first transistor is equal to a first voltage level, and in response, causing the precharge of the control electrode of the first transistor to be stopped at the first predetermined voltage. The switching circuit may further comprise a second comparator for sensing when the voltage at the control electrode of the second transistor is equal to or less than a second voltage level, and in response, causing the control electrode of the first transistor to receive the second predetermined voltage. The second comparator may further comprise an output coupled to an input of the first driver circuit. The switching circuit may further comprise: a third transistor having a first current electrode coupled to the first power supply voltage terminal, a control electrode coupled to the control electrode of the first transistor, and a second current electrode coupled to an input of the first comparator; and a resistive element having a first terminal coupled to the second current electrode of the third transistor, and a second terminal coupled to the second power supply voltage terminal. The switching circuit may further comprise: a current source having a first terminal coupled to the first power supply voltage terminal, and a second terminal; a switch having a first terminal coupled to the second terminal of the current source, a control terminal coupled to receive a control signal, and a second terminal; and a bootstrap capacitor having a first plate electrode coupled to the second terminal of the switch, and a second plate electrode coupled to the second current electrode of the first transistor.

In another aspect, there is provided a switching circuit configured as a half bridge, the switching circuit comprising: a high side transistor having a first current electrode coupled to a first power supply voltage terminal, a second current electrode, and a control electrode; a low side transistor having a first current electrode coupled to the second current electrode of the high side transistor, a second current electrode coupled to a second power supply voltage terminal, and a control electrode; a high side driver circuit having an input for receiving an input signal, and an output coupled to the control electrode of the high side transistor, the high side driver circuit for precharging the control electrode of the high side transistor to a first predetermined voltage, and in response to the input signal transitioning from a first logic state to a second logic state, the high side driver circuit providing a second predetermined voltage to the control electrode of the high side transistor to cause the high side transistor to be conductive; and a low side driver circuit having an input for receiving the input signal, and an output coupled to the control electrode of the low side transistor. The switching circuit may further comprise a comparator having a first input terminal coupled to the control electrode of the high side transistor, a second input terminal coupled to a sensing circuit, and an output terminal, wherein the comparator provides a logic signal in response to sensing that the first predetermined voltage has been reached. The switching circuit may further comprise a comparator having a first input terminal coupled to the control electrode of the low side transistor, a second input terminal coupled to a voltage source, and an output terminal for providing a logic signal in response to detecting that a voltage at the control electrode of the low side transistor has decreased to be equal to or below a voltage of the voltage source. The switching circuit may further comprise: a current source having a first terminal coupled to the first power supply voltage terminal, and a second terminal; a switch having a first terminal coupled to the second terminal of the current source, a control terminal coupled to receive the logic signal from the comparator, and a second terminal; and a bootstrap capacitor having a first plate electrode coupled to the second terminal of the switch, and a second plate electrode coupled to the second current electrode of the high side transistor. The high side transistor and the low side transistor may both be characterized as being power NMOS transistors. The first predetermined voltage may be equal to approximately a threshold voltage of the high side transistor.

In yet another aspect, there is provided in a switching circuit having a high side transistor coupled to a low side transistor in a half bridge configuration, a method comprising: precharging a control electrode of the high side transistor to a first predetermined voltage while the low side transistor is conductive; causing the low side transistor to become substantially non-conductive; and sensing when the low side transistor becomes substantially non-conductive, and in response, driving the control electrode of the high side transistor with a second predetermined voltage to cause the high side transistor to be conductive. The first predetermined voltage may be equal to approximately a threshold voltage of the high side transistor. The method may further comprise detecting when the control electrode of the high side transistor has been precharged to the first predetermined voltage, and in response, stopping the precharging. The step of precharging the control electrode of the high side transistor may further comprise precharging the control electrode using a power supply voltage. The step of driving the control electrode of the high side transistor with a second predetermined voltage may further comprise driving the control electrode of the high side transistor using a third predetermined voltage, wherein the third predetermined voltage is higher than the power supply voltage.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

FIG. 1 illustrates, in partial block diagram form and partial schematic diagram form, a switching circuit 10 in accordance with an embodiment. Switching circuit 10 includes high side transistor 12, low side transistor 14, high side driver 16, low side driver 18, transistor 20, resistor 22, and capacitor 24. In the illustrated embodiment, high side transistor 12 and low side transistor 14 are both power NMOS (N-channel metal oxide semiconductor) transistors. Transistors 12 and 14 are very large power MOS transistors implemented on silicon die. In one embodiment, transistors 12 and 14 are vertical NMOS transistors having a vertically stacked source, channel region, and drain so that current flow is through a thickness of a semiconductor die rather than laterally as in a planar transistor. The gate may be formed from polysilicon. Transistors 12 and 14 may have an output current between about 30 and 250 amperes. In other embodiments, transistors 12 and 14 may be a different type of transistor, such as for example, PMOS (P-channel metal oxide semiconductor) transistors. High side transistor 12 has a first current electrode (drain) coupled to a power supply voltage terminal labeled "$V_{BAT}$", a control electrode (gate) for receiving a high side gate voltage labeled "$V_{GHS}$", and a second current electrode (source) for providing an output voltage labeled "OUT". Low side transistor 14 has a first current electrode coupled to the second current electrode of high side transistor 12, a control electrode for receiving a low side gate voltage labeled "$V_{GLS}$", and a second current electrode coupled to a power supply voltage terminal labeled "GND". In the illustrated embodiment, $V_{BAT}$ is coupled to receive a 12 volt supply voltage from an automobile battery and GND is coupled to ground. In other embodiments, the power supply voltage may be different. High side driver 16 has a first input terminal coupled to receive an input voltage labeled "IN", a second input terminal coupled to receive a low side off signal labeled "$LS_{OFF}$", a supply voltage terminal coupled to $V_{BAT}$, a terminal coupled to provide a bootstrap voltage labeled "$V_{BC}$", an output terminal for providing high side gate voltage $V_{GHS}$ to the control electrode of transistor 12, a third input terminal for receiving a voltage labeled "SENSE", and a fourth input terminal coupled to output terminal OUT. Low side driver 18 has a first input terminal coupled to receive input voltage IN, a first output terminal coupled to the second input terminal of high side driver 16 for providing signal $LS_{OFF}$, a power supply voltage terminal for receiving a power supply voltage labeled $V_{DD}$, a power supply voltage terminal for receiving $V_{BAT}$, a second output terminal coupled to provide low side gate voltage "$V_{GLS}$" to the control electrode of transistor 14, and a power supply terminal coupled to GND. N-channel transistor 20 has a first current electrode coupled to $V_{BAT}$, a control electrode coupled to receive $V_{GHS}$ from high side driver 16, and a second current electrode coupled to the third input terminal for providing sense voltage SENSE. Resistor 22 has a first terminal coupled to the second current electrode of transistor 20, and a second terminal coupled to output terminal OUT. Bootstrap capacitor 24 has a first plate electrode coupled to receive bootstrap voltage $V_{BC}$ from high side driver 16, and a second plate electrode coupled to output terminal OUT.

High side gate driver 16 functions to supply high side gate voltage $V_{GHS}$ to the gate of high side transistor 12. Low side gate driver 18 functions to supply the gate of low side transistor 22 with low side gate voltage $V_{GLS}$. The operations of high side gate driver circuit 16 and low side gate driver circuit 18 are controlled and synchronized by a control unit (not shown). A device to be driven (not shown), for example a motor, is connected to output terminal OUT. Generally, transistors 12 and 14 are alternately turned on and off with no overlap in the "on" times. The high side transistor 12 controls the connection to supply voltage $V_{BAT}$ and low side transistor 14 controls the connection to ground (GND).

In operation, when input signal IN is a logic low, gate voltage $V_{GLS}$ is supplied to cause low side transistor 14 to be on, or conducting, while high side transistor 12 is supplied with a gate voltage $V_{GHS}$ that causes transistor 12 to be off, or substantially non-conducting. When input signal IN becomes a logic high, low side driver 18 supplies the gate of transistor 14 with a voltage $V_{GLS}$ to cause transistor 14 to become substantially non-conductive. Generally, to prevent both of transistors 12 and 14 from being on at the same time, there is a delay between transistor 14 turning off and transistor 12 turning on. The delay can be built into the high side and low side driver circuits. Regarding high side transistor 12, the logic high input signal IN first causes voltage $V_{GHS}$ to precharge to a predetermined voltage. High side driver 16 uses the battery voltage $V_{BAT}$ to precharge $V_{GHS}$ instead of using boot strap voltage $V_{BC}$. In one embodiment, the predetermined voltage is equal to about a threshold voltage ($V_T$) of transistor 12. In the illustrated embodiment, the $V_T$ of transistor 12 is about 2.5 volts. Transistor 20 and resistor 22 are used to sense when the $V_T$ is reached. After the precharge voltage $V_T$ has been reached, high side driver 16 then stops the precharge of the gate of transistor 12 at the $V_T$. The circuit then waits until gate voltage $G_{HLS}$ drops below a predetermined level. A parasitic gate capacitance of transistor 12 is used to hold the precharge voltage on the gate of transistor 12. Low side driver circuit 18 senses when the gate voltage $V_{GLS}$ drops below a predetermined voltage level and asserts control signal $LS_{OFF}$ to high side driver 16 to indicate that transistor 14 is off, or substantially non-conductive. In the illustrated embodiment, the predetermined voltage level for $V_{GLS}$ is about 0.5 volts. In response to control signal $LS_{OFF}$, high side driver 16 begins to increase, or drive the gate voltage $V_{GHS}$ at the gate of high side transistor 12 up to a voltage level needed to fully turn on transistor 12. A charge stored on boot strap capacitor 24 is used to boost $V_{GHS}$ to above supply voltage $V_{BAT}$. When the required gate voltage $V_{GHS}$ is reached, output signal OUT will ramp up.

By precharging the gate of high side transistor 12, high side transistor 12 will turn on faster when the low side transistor 14 turns off. Also, by ramping up the gate voltage from $V_T$ instead of ground, less EMI is produced. In addition, by precharging the gate using the supply voltage ($V_{BAT}$) instead of the boot strap capacitor voltage ($V_{BC}$), charge is saved, so that there is less voltage drop of voltage $V_{BC}$ during turn-on of high side transistor 12.

Figure 2:
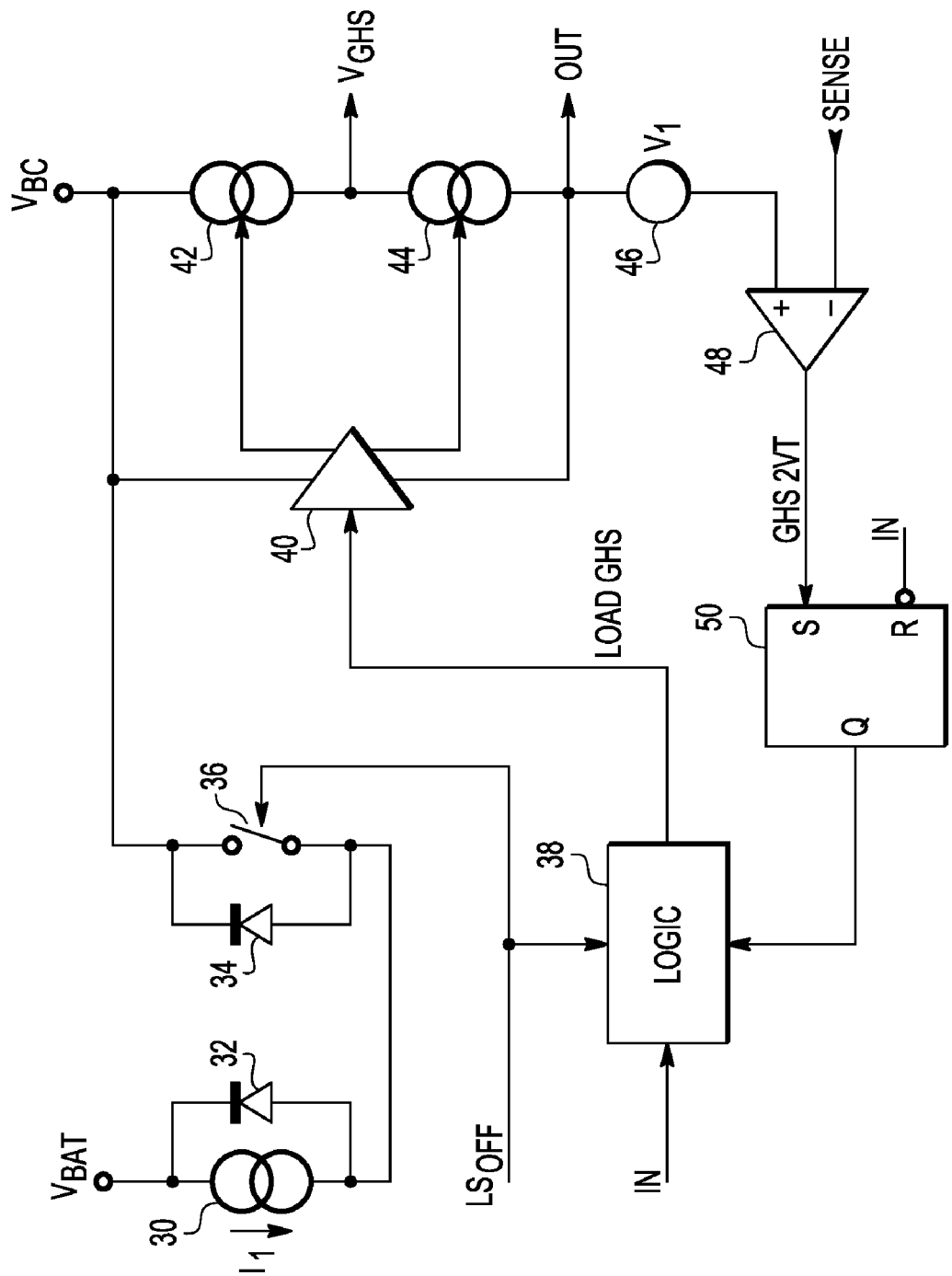
FIG. 2 illustrates in partial block diagram form and partial schematic diagram form, one embodiment of the high side driver circuit of FIG. 1.

FIG. 2 illustrates in partial block diagram form and partial schematic diagram form, one embodiment of high side driver circuit 16 of FIG. 1. High side driver 16 includes current sources 30, 42, and 44, diodes 32 and 34, switch 36, logic circuit 38, buffer 40, voltage source 46, comparator 48, and SR flip-flop 50. Current source 30 has a first terminal coupled to $V_{BAT}$, and a second terminal for providing a current labeled "I1". In one embodiment, current source 30 may be a PMOS transistor biased to provide a relatively constant current. Diode 32 has a first terminal coupled to $V_{BAT}$, and a second terminal coupled to the second terminal of current source 30. Switch 36 has a first terminal coupled to the second terminal of current source 30, a second terminal coupled to $V_{BC}$, and a control terminal for receiving control signal $LS_{OFF}$. Diode 34 has a first terminal coupled to the first terminal of switch 36, and a second terminal coupled to the second terminal of switch 36. Logic circuit 38 has a first input for receiving input signal IN, a second input for receiving $LS_{OFF}$, a third input, and an output for providing control signal "LOADGHS". Buffer 40 has an input coupled to the output of logic circuit 38, a first supply voltage terminal coupled to the second terminal of switch 36, a second supply terminal coupled to output terminal OUT, a first output terminal, and a second output terminal. Current source 42 has a first terminal coupled to receive $V_{BC}$, a second terminal coupled to receive high side gate voltage $V_{GHS}$, and a control terminal coupled to the first output terminal of buffer 40. Current source 44 has a first terminal coupled to $V_{GHS}$, a second terminal coupled to OUT, and a control terminal coupled to the second output terminal of buffer 40. Voltage source 46 has a first terminal coupled to output terminal OUT, and a second terminal for providing a voltage labeled "$V_1$". Comparator 48 has a positive input terminal coupled to the second terminal of voltage source 46, a negative input terminal coupled to the second current electrode of transistor 20 for receiving signal SENSE, and an output terminal for providing control signal GHS2VT. Flip-flop 50 has a set (S) input coupled to the output terminal of comparator 48, a reset (R) input for receiving an logical inverse of input signal IN, and an output (Q) coupled to the third input of logic circuit 38.

Figure 3:
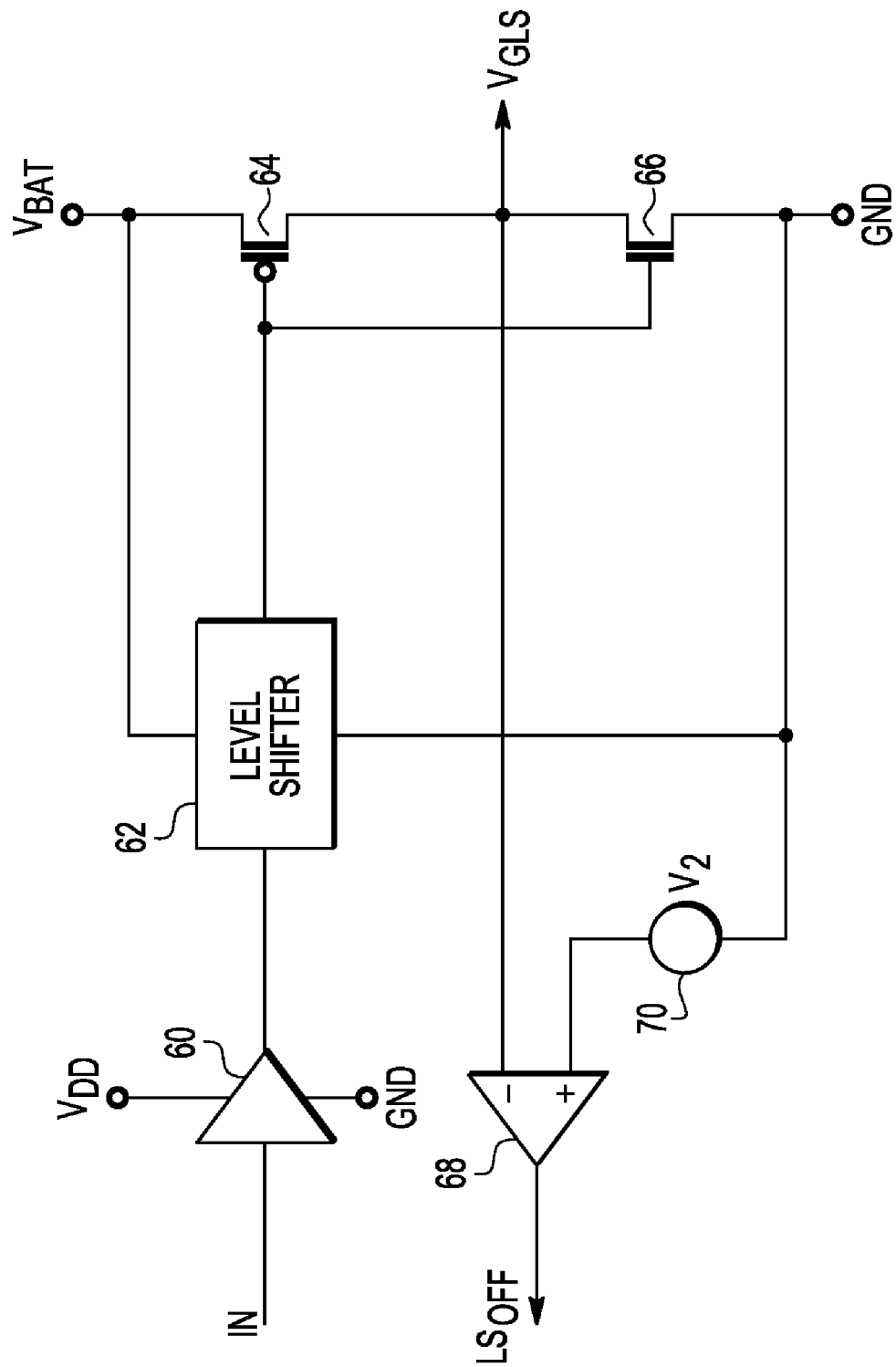
FIG. 3 illustrates, in partial block diagram form and partial schematic diagram form, one embodiment of the low side driver circuit of FIG. 1.

FIG. 3 illustrates, in partial block diagram form and partial schematic diagram form, one embodiment of low side driver circuit 18 of FIG. 1. Low side driver circuit 18 includes buffer 60, level shifter 62, P-channel transistor 64, N-channel transistor 66, comparator 68, and voltage source 70. Buffer 60 has an input terminal for receiving signal IN, a first supply terminal coupled to $V_{DD}$, a second supply terminal coupled to GND, and an output terminal. Level shifter 62 has an input terminal coupled to the output terminal of buffer 60, a first supply terminal coupled to $V_{BAT}$, a second supply terminal coupled to GND, and an output terminal. P-channel transistor 64 has a first current electrode coupled to $V_{BAT}$, a control electrode coupled to the output terminal of level shifter 62, and a second current electrode coupled to provide low side gate voltage $V_{GLS}$. N-channel transistor 66 has a first current electrode coupled to the second current electrode of transistor 64, a control electrode coupled to the output terminal of level shifter 62, and a second current electrode coupled to GND. Voltage source 70 has a first terminal coupled to GND, and a second terminal for providing a voltage labeled "$V_2$". Comparator 68 has a negative terminal coupled to the second current electrode of P-channel transistor 64, a positive input terminal coupled to the second terminal of voltage source 70, and an output terminal for providing low side off signal $LS_{OFF}$.

Referring to both FIG. 2 and FIG. 3, the operation of high side driver 16 and low side driver 18 will be discussed. When input signal IN transitions from a logic low to a logic high, low side off signal $LS_{OFF}$ is a logic low causing switch 36 to be closed, or conductive, and signal LOAD GHS to be asserted as a logic high by logic 38. The asserted signal LOAD GHS is provide to the input of buffer 40. Buffer 40 then causes current source 42 to provide a charge current to $V_{GHS}$. Current source 44 is non-conductive. Note that current sources 42 and 44 may be implemented using one or more CMOS (complementary metal oxide semiconductor) inverters and the output signals of buffer 40 will be the same. Comparator 48 and voltage source 46 sense when $V_{GHS}$ is charged to the predetermined voltage level. As stated above, the predetermined voltage level in the illustrated embodiment is equal to about a $V_T$ of transistor 12. Voltage source 46 is used to set the trip point of comparator 48. When the voltage $V_{GHS}$ is at a $V_T$ of transistor 12, comparator 48 provides a logic high signal GHS2$V_T$ to the set (S) input of flip-flop 50. The output Q of flip-flop 50 provides a signal corresponding to GHS2$V_T$ to logic 38, and signal LOAD GHS is negated as a logic low. Because signal IN is a logic high, buffer 60 and level shifter 62 provide a logic high to transistors 64 and 66 (FIG. 3), causing transistor 64 to be substantially non-conductive and transistor 66 to be conductive. Level shifter 62 is a conventional level shifter for converting input signal IN from voltage $V_{DD}$ to voltage $V_{BAT}$. Note that $V_{DD}$ is lower than $V_{BAT}$ in the illustrated embodiment. In other embodiments, $V_{DD}$ may be the same voltage as $V_{BAT}$ and level shifter 62 would not be need. Also, in other embodiments, $V_{DD}$ may be higher than $V_{BAT}$. The conductive transistor 66 causes low side gate voltage $V_{GLS}$ to begin to decrease to ground potential. Comparator 68 compares the voltage of $V_{GLS}$ to voltage $V_2$ to detect when $V_{GLS}$ has dropped to below a predetermined voltage level determined by voltage $V_2$. In the illustrated embodiment, $V_2$ is equal to about 0.5 volts. In other embodiments, voltage $V_2$ may be different. When $V_{GLS}$ drops below $V_2$, low side off signal LS$_{OFF}$ becomes a logic high, causing switch 36 to open. Signal LOAD GHS also becomes a logic high and $V_{GHS}$ is increased by current source 42 and boot strap voltage $V_{BC}$. Boot strap voltage $V_{BC}$ will follow the output voltage OUT with a voltage shift of about 10 volts in the illustrated embodiment. Boot strap voltage $V_{BC}$ is higher than supply voltage $V_{BAT}$ and diode 34 prevents discharge of capacitor 24 to $V_{BAT}$. After a predetermined time period, input signal IN transitions from a logic high to a logic low voltage causing high side transistor 12 to become non-conductive and low side transistor 14 to become conductive.

Figure 4:
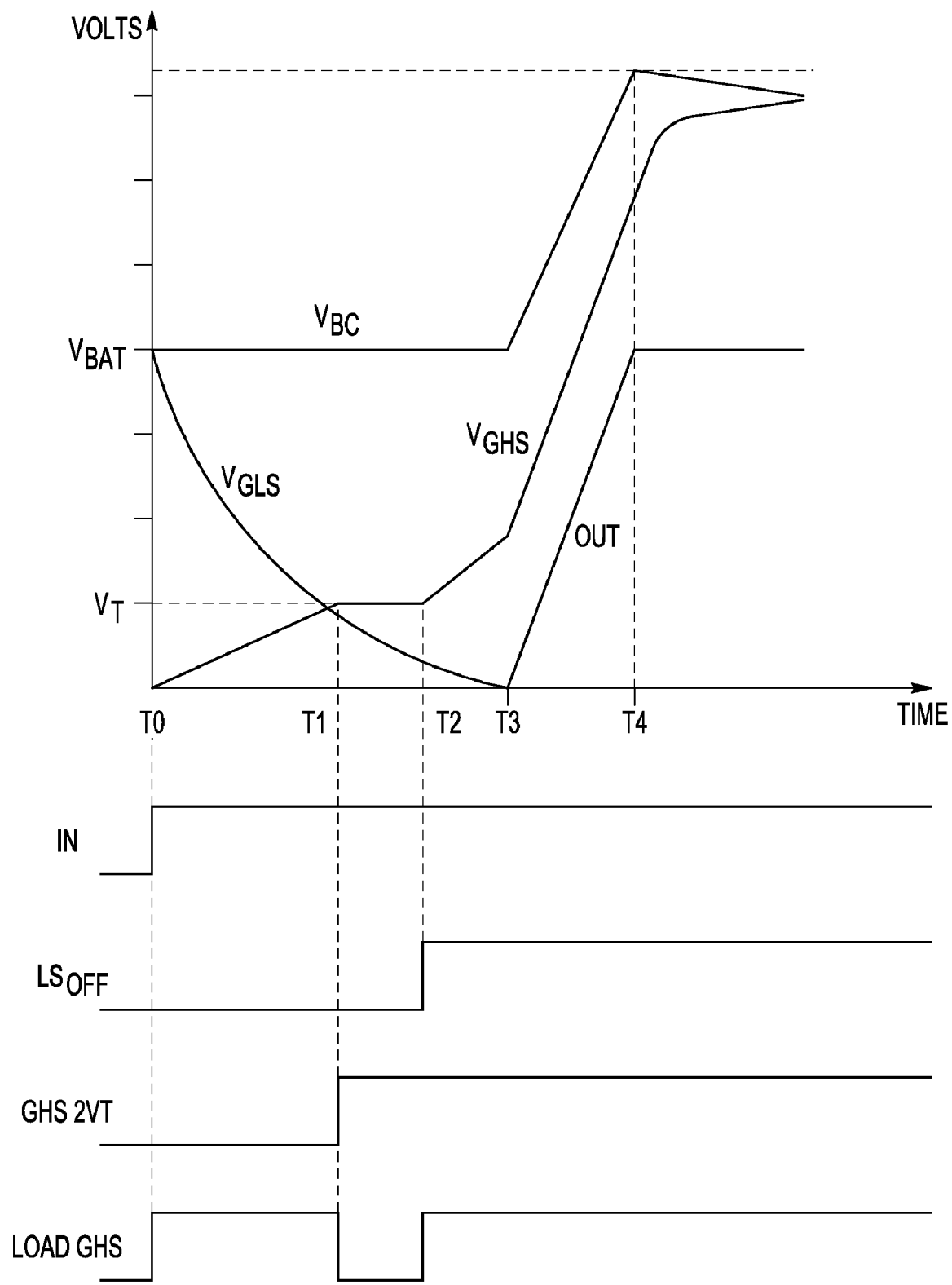
FIG. 4 illustrates various voltages and signals useful for understanding the operation of the switching circuit of FIG. 1.

FIG. 4 illustrates various voltages and signals useful for understanding the operation of the switching circuit of FIG. 1. In FIG. 4, prior to time T0, input signal IN is low, low side gate voltage $V_{GLS}$ is high, high side gate voltage $V_{GHS}$ is low, and output voltage OUT is low. Boot strap voltage $V_{BC}$ is equal to about $V_{BAT}$. Transistor 12 is non-conductive and transistor 14 is conductive. At time T0, input voltage IN transitions to a logic high causing low side gate voltage $V_{GLS}$ to begin to transition low. Also, high side gate voltage $V_{GHS}$ begins to precharge to voltage $V_T$ in response to signal LOAD GHS transitioning high. Note that high side gate voltage $V_{GHS}$ is precharged using supply voltage $V_{BAT}$ and boot strap voltage $V_{BC}$ does not drop. The precharge period extends between times T0 and T1. When the precharge voltage $V_T$ is reached at time T1, signal GHS2$V_T$ goes high and signal LOAD GHS returns to a logic low causing precharging to be stopped at time T1. High side transistor 12 is still substantially non-conductive. The precharge voltage of $V_{GHS}$ is held between times T1 and T2. When voltage $V_{GLS}$ drops below the predetermined voltage level defined by voltage $V_2$, transistor 14 is determined to be off, signal LS$_{OFF}$ transitions high resulting in signal LOAD GHS transitioning high. The voltage level of high side gate voltage $V_{GHS}$ is increased to the voltage level needed to make transistor 12 fully conductive. High side gate voltage $V_{GHS}$ begins to ramp relatively slowly between times T2 and T3 and the ramp rate increases after time T3. When voltage $V_{GHS}$ becomes equal to about $V_{BAT}$ at time T3, transistor 12 becomes conductive and output voltage OUT begins to increase. Also, boot strap voltage $V_{BC}$ follows the output voltage and increases above $V_{BAT}$. At time T4, the voltage $V_{BC}$ begins to discharge as output voltage OUT levels out at about $V_{BAT}$.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

It is to be understood that the circuits depicted herein are merely exemplary, and that in fact many other circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of circuits or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A switching circuit comprising:
   a first transistor having a first current electrode coupled to a first power supply voltage terminal, a second current electrode, and a control electrode;
   a second transistor having a first current electrode coupled to the second current electrode of the first transistor, a second current electrode coupled to a second power supply voltage terminal, and a control electrode; and
   a first driver circuit having an input for receiving an input signal, and an output coupled to the control electrode of the first transistor, the first driver circuit for precharging the control electrode of the first transistor to a first predetermined voltage, the first driver circuit comprising a first comparator, and in response to the comparator sensing that a voltage at the control electrode of the first transistor is equal to a first voltage level, causing the precharging of the control electrode of the first transistor to be stopped at the first predetermined voltage, and in response to the input signal transitioning from a first logic state to a second logic state, the first driver circuit providing a second predetermined voltage to the control electrode of the first transistor to cause the first transistor to be conductive.

2. The switching circuit of claim 1, wherein the first predetermined voltage is equal to approximately a threshold voltage of the first transistor.

3. The switching circuit of claim 1, further comprising a second driver circuit having an output coupled to the control electrode of the second transistor.

4. The switching circuit of claim 1, wherein the second predetermined voltage is above a power supply voltage provided to the first power supply voltage terminal.

5. The switching circuit of claim 1, further comprising a second comparator for sensing when the voltage at the control electrode of the second transistor is equal to or less than a second voltage level, and in response, causing the control electrode of the first transistor to receive the second predetermined voltage.

6. The switching circuit of claim 5, wherein the second comparator further comprises an output coupled to an input of the first driver circuit.

7. The switching circuit of claim 1, further comprising:
   a third transistor having a first current electrode coupled to the first power supply voltage terminal, a control electrode coupled to the control electrode of the first transistor, and a second current electrode coupled to an input of the first comparator; and
   a resistive element having a first terminal coupled to the second current electrode of the third transistor, and a second terminal coupled to the second power supply voltage terminal.

8. The switching circuit of claim 1, further comprising:
   a current source having a first terminal coupled to the first power supply voltage terminal, and a second terminal;
   a switch having a first terminal coupled to the second terminal of the current source, a control terminal coupled to receive a control signal, and a second terminal; and
   a bootstrap capacitor having a first plate electrode coupled to the second terminal of the switch, and a second plate electrode coupled to the second current electrode of the first transistor.

9. A switching circuit configured as a half bridge, the switching circuit comprising:
   a high side transistor having a first current electrode coupled to a first power supply voltage terminal, a second current electrode, and a control electrode;
   a low side transistor having a first current electrode coupled to the second current electrode of the high side transistor, a second current electrode coupled to a second power supply voltage terminal, and a control electrode;
   a high side driver circuit having an input for receiving an input signal, and an output coupled to the control electrode of the high side transistor, the high side driver circuit for precharging the control electrode of the high side transistor to a first predetermined voltage, and in response to the input signal transitioning from a first logic state to a second logic state, the high side driver circuit providing a second predetermined voltage to the control electrode of the high side transistor to cause the high side transistor to be conductive;
   a comparator having a first input terminal coupled to the control electrode of the low side transistor, a second input terminal coupled to a voltage source, and an output terminal for providing a logic signal in response to detecting that a voltage at the control electrode of the low side transistor has decreased to be equal to or below a voltage of the voltage source; and
   a low side driver circuit having an input for receiving the input signal, and an output coupled to the control electrode of the low side transistor.

10. The switching circuit of claim 9, further comprising a comparator having a first input terminal coupled to the control electrode of the high side transistor, a second input terminal coupled to a sensing circuit, and an output terminal, wherein the comparator provides a logic signal in response to sensing that the first predetermined voltage has been reached.

11. The switching circuit of claim 9, further comprising:
    a current source having a first terminal coupled to the first power supply voltage terminal, and a second terminal;
    a switch having a first terminal coupled to the second terminal of the current source, a control terminal coupled to receive the logic signal from the comparator, and a second terminal; and
    a bootstrap capacitor having a first plate electrode coupled to the second terminal of the switch, and a second plate electrode coupled to the second current electrode of the high side transistor.

12. The switching circuit of claim 9, wherein the high side transistor and the low side transistor are both characterized as being power NMOS transistors.

13. The switching circuit of claim 9, wherein the first predetermined voltage is equal to approximately a threshold voltage of the high side transistor.

14. In a switching circuit having a high side transistor coupled to a low side transistor in a half bridge configuration, a method comprising:
    precharging a control electrode of the high side transistor to a first predetermined voltage while the low side transistor is conductive;
    detecting when the control electrode of the high side transistor has been precharged to the first predetermined voltage, and in response, stopping the precharging;
    causing the low side transistor to become substantially non-conductive; and sensing when the low side transistor becomes substantially non-conductive, and in response, driving the control electrode of the high side transistor with a second predetermined voltage to cause the high side transistor to be conductive.

15. The method of claim 14, wherein the first predetermined voltage is equal to approximately a threshold voltage of the high side transistor.

16. The method of claim 14, wherein precharging the control electrode of the high side transistor further comprises precharging the control electrode using a power supply voltage.

17. The method of claim 16, wherein driving the control electrode of the high side transistor with a second predetermined voltage further comprises driving the control electrode of the high side transistor using a third predetermined voltage, wherein the third predetermined voltage is higher than the power supply voltage.

* * * * *